(12) United States Patent
Ganesan et al.

(10) Patent No.: US 8,971,455 B2
(45) Date of Patent: Mar. 3, 2015

(54) NEAR-INTEGER CHANNEL SPUR MITIGATION IN A PHASE-LOCKED LOOP

(75) Inventors: Raghu Ganesan, Bangalore (IN); Saket Jalan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 13/323,195

(22) Filed: Dec. 12, 2011

(65) Prior Publication Data

US 2013/0147529 A1    Jun. 13, 2013

(51) Int. Cl.
 *H03L 7/06* (2006.01)
(52) U.S. Cl.
 USPC ............ 375/327; 375/227; 375/376; 327/159
(58) Field of Classification Search
 USPC ................... 375/327, 376, 227; 327/159
 See application file for complete search history.

(56) References Cited

U.S. PATENT DOCUMENTS 5,070,310 A * 12/1991 Hietala et al. ................. 331/1 A
2006/0164132 A1* 7/2006 Martin et al. ................. 327/105

* cited by examiner

*Primary Examiner* — Michael Neff
(74) *Attorney, Agent, or Firm* — Ronald O. Neerings; Frederick J. Telecky, Jr.

(57) ABSTRACT

A method includes relocating, to a frequency outside a cut-off frequency of a phase-locked loop, a spur frequency component at an input of the phase-locked loop coupled thereto due to an interference of a divided frequency component of an output frequency of the phase-locked loop with a reference clock frequency input thereto through a feedback path thereof when there is a near-integer relationship between the reference clock frequency input and the output frequency. The method also includes filtering the spur frequency component through the phase-locked loop.

19 Claims, 6 Drawing Sheets

FIG. 8A  ADPLL 300 WITHOUT CLOCK GATING/SHAPING

FIG. 8B  ADPLL 300 WITH CLOCK GATING/SHAPING

FIG. 9

NEAR-INTEGER CHANNEL SPUR MITIGATION IN A PHASE-LOCKED LOOP

FIELD OF TECHNOLOGY

Embodiments of the disclosure relate generally to phase-locked loops and, more particularly, to near-integer channel spur mitigation in a phase-locked loop.

BACKGROUND

A phase-locked loop (PLL) is employed in a communication system (e.g., wireless communication system), for example, to generate a carrier frequency for transmission through a transmitter and/or to select a channel frequency of reception at a receiver therein. The PLL may be configured to lock to a desired frequency through adjusting a frequency of an output to match a phase of the output with that of a reference input thereto. Types associated with PLLs include analog PLL, digital PLL, All-Digital PLL (ADPLL) and software PLL.

The ADPLL is a digital architectural solution of a PLL. Advantages of the ADPLL include easy integration with digital base-band, programmability and robustness. The design associated with the ADPLL can be easily migrated to newer process/technology nodes due to the intrinsic digital architecture including a digitally-controlled oscillator (DCO) and a time-to-digital converter (TDC). The DCO does not require an analog control and may be configured to perform frequency control digitally through switching varactors. Fine frequency resolution is achieved through high-speed sigma-delta dithering. The TDC is a part of the phase detector and may include a chain of invertors and flip-flops to perform a fine measurement of a phase difference between the reference clock of the ADPLL and the oscillator output clock.

A low-pass digital filter (e.g., a loop filter) is configured to extract the low-pass portion of the output of an integrator configured to control the DCO. The ADPLL includes a slicer configured to convert a base reference frequency (e.g., from a temperature compensated crystal oscillator (TCXO)) to a frequency associated with the digitized reference clock input to the phase detector. The ADPLL also includes a divider in a feedback path configured to count the oscillator output frequency clock, which is sampled by the reference clock. The sampled count value along with the fractional count value provided by the TDC may be compared with the expected counted value derived from a desired relation between the reference frequency and output frequency to obtain the digital phase error samples.

When there is a near-integer relationship between the output frequency and the reference clock frequency input, the divided frequency components of the output frequency is undesirably coupled to the input of the slicer to cause spur frequency components associated therewith to be manifested at the output of the slicer. The spur frequency components are then coupled to the ADPLL, which, consequently, degrades phase noise and/or the Error Vector Magnitude (EVM) of, for example, a transceiver in which the ADPLL is employed.

SUMMARY

Disclosed are a method, an apparatus and/or a system to mitigate the effects of near-integer channel spurs in a phase-locked loop.

In one embodiment, a method includes relocating, to a frequency outside a cut-off frequency of a phase-locked loop, a spur frequency component at an input of the phase-locked loop coupled thereto due to an interference of a divided frequency component of an output frequency of the phase-locked loop with a reference clock frequency input thereto through a feedback path thereof when there is a near-integer relationship between the reference clock frequency input and the output frequency. The method also includes filtering the spur frequency component through the phase-locked loop.

In another embodiment, a phase-locked loop includes a phase detector, a divider, a clock gating circuit, a loop filter, and a control oscillator. The phase detector is configured to receive a reference clock frequency input, a count value of a number of clock cycles of an output frequency of the phase-locked loop and a fractional count value associated with a fractional number of clock cycles of the output frequency. The phase detector is also configured to sample the count value and the fractional count value at every clock cycle of the reference clock frequency input, to calculate a difference between the sampled count value and an expected count value derived from a relation between the output frequency and the reference clock frequency input, and to output a phase error associated with the difference therebetween. The divider is coupled to the phase detector and is configured to operate on the output frequency, to generate a divided frequency component of the output frequency, to count clock cycles associated with the output frequency, and to feed the count value to the phase detector.

The clock gating circuit is coupled to the divider and is configured to enable gating of one or more clock cycle(s) of the output frequency configured to be operated on by the divider during every clock cycle of the reference clock frequency input when there is a near-integer relationship between the output frequency and the reference clock frequency input through a clock gating signal generated therein. The gating is configured to effect relocation of a spur frequency component at an input of the phase-locked loop coupled thereto due to an interference of the divided frequency component with the reference clock frequency input to a frequency outside the cut-off frequency of the phase-locked loop through speeding up a phase variation of the divided frequency component with respect to the reference clock frequency input at successive zero-crossings thereof. The loop filter is configured to receive the phase error from the phase detector, to generate a control signal based on the phase error, and to filter the spur frequency component and the control oscillator is configured to control the output frequency of the phase-locked loop based on the control signal from the loop filter. The control oscillator is coupled to the clock gating circuit and the fractional count value is obtained through processing the output frequency from the control oscillator.

In yet another embodiment, a circuit includes a delay logic and a pulse generation logic. The delay logic is configured to receive a re-sampled version of a reference clock frequency input to a phase-locked loop and to delay the re-sampled version by one or more clock cycle(s) of an output frequency of the phase-locked loop, a divided frequency component of which is configured to be fed back as another input thereto. The re-sampled version is generated through a re-sampling logic, associated with the phase-locked loop and configured to re-sample the reference clock frequency input with a falling edge or a rising edge of the output frequency.

The pulse generation logic is configured to generate a clock gating signal based on the re-sampled version of the reference clock frequency input and the delayed re-sampled version thereof. The clock gating signal is configured to change to a second constant state thereof for a time interval corresponding to the delay between the re-sampled version of the reference clock frequency input and the delayed re-sampled version thereof within every clock cycle of the reference clock frequency input from a first constant state corresponding to all other time intervals therein.

The clock gating signal is further configured to enable gating of the one or more clock cycle(s) of the output frequency of the phase-locked loop during every clock cycle of the reference clock frequency input when there is a near-integer relationship between the output frequency and the reference clock frequency input. The gating is configured to effect relocation of a spur frequency component at an input of the phase-locked loop coupled thereto due to an interference of the divided frequency component of the output frequency with the reference clock frequency input to a frequency outside the cut-off frequency of the phase-locked loop through speeding up a phase variation of the divided frequency component with respect to the reference clock frequency input at successive zero-crossings thereof. The spur frequency component is configured to be filtered through the phase-locked loop.

The methods and systems disclosed herein may be implemented in any means for achieving various aspects, and may be executed in a form of a machine-readable medium embodying a set of instructions that, when executed by a machine, causes the machine to perform any of the operations disclosed herein.

Other features will be apparent from the accompanying drawings and from the detailed description that follows.

BRIEF DESCRIPTION OF THE VIEWS OF DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a method, an apparatus and/or a system to mitigate the effects of near-integer channel spurs in a phase-locked loop. Although the present embodiments have been described with reference to specific example embodiments, it will be evident that various modifications and changes may be made to these embodiments without departing from the broader spirit and scope of the various embodiments.

Figure 1:
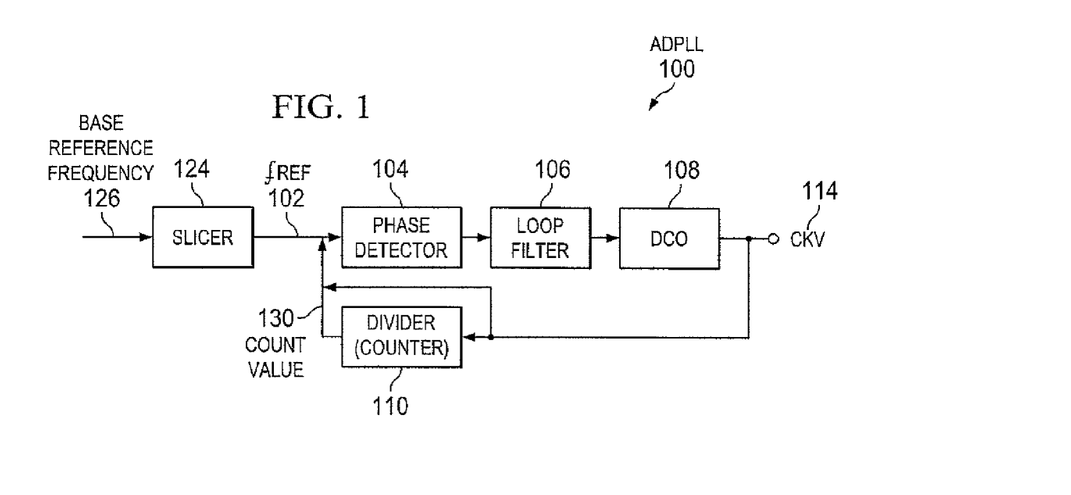
FIG. 1 is a schematic view of an All-Digital Phase-Locked Loop (ADPLL)

FIG. 1 shows an All-Digital Phase Locked Loop (ADPLL) 100. ADPLL 100 includes a phase detector 104 configured to receive a reference clock signal, $f_{ref}$ 102, and an output signal, CKV 114, fed back thereto to detect a frequency/phase difference between $f_{ref}$ 102 and CKV 114, and to output an error signal proportional thereto. The error signal is filtered through loop filter 106 (e.g., a low pass filter (LPF)). Loop filter 106 is configured to adjust the output of Digital Control Oscillator (DCO) 108, which may be the core of ADPLL 100. Loop filter 106 includes a digital proportional-integral (PI) controller (not shown) to effectively filter the phase error to provide a control for DCO 108.

In one or more embodiments, DCO 108 does not require analog control. A digital output word from loop filter 106 is configured to control the frequency of DCO 108 by changing the capacitance of varactors. For example, DCO 108 includes an array of capacitors, to which a control voltage is changed to effect an appropriate change in frequency. DCO 108 also includes a sigma-delta modulator (not shown) configured to increase the output frequency resolution thereof.

A counter (not shown) is employed in ADPLL 100 to count the output frequency (e.g., CKV 114) clocks. The counter is sampled by $f_{ref}$ 102 to provide the current integer count of the output frequency (e.g., CKV 114) clock at a zero-crossing timestamp of $f_{ref}$ 102. In an embodiment, ADPLL 100 also include a time-to-digital converter (TDC; not shown) associated with phase detector 104 configured to provide the fractional count of the output frequency (e.g., CKV 114) clock at the zero-crossing time stamp of $f_{ref}$ 102. The integer and the fractional count (measured count) is subtracted from the expected count derived from the desired frequency relation between $f_{ref}$ 102 and CKV 114 to obtain the phase error samples.

For example, whenever the phase error is positive, the output of DCO 108 may be increased in frequency, and whenever the phase error is negative, the output of DCO 108 (e.g., CKV 114) may be decreased in frequency. CKV 114 is divided through a divider 110 (e.g., a ripple counter) in the feedback path to provide the count value (e.g., count value 130) for phase detection purposes and also to generate clocks for various synchronous operations. FIG. 1 shows divider 110 as a counter. The count value is associated with the integer number of output clock cycles (e.g., CKV 114) within one $f_{ref}$ 102 clock cycle. Thus, the inputs to phase detector 104 may include $f_{ref}$ 102, count value 130 (integer) and the output of DCO 108 (or, input to divider 110) configured to be utilized in a time-to-digital converter (TDC) to obtain a fractional count value associated with the fraction of the output clock cycle (e.g., CKV 114) within one $f_{ref}$ 102 clock cycle. One skilled in the art will appreciate that the aforementioned examples of loop filter 106, phase detector 104 and DCO 108 are merely for purposes of illustration of working of ADPLL 100, and that other configurations may be employed.

In an embodiment, in radio transmitters, the output of ADPLL 100 (e.g., CKV 114) is the carrier frequency. Base reference frequency 126 to ADPLL 100 originates from a crystal oscillator (e.g., temperature compensated crystal oscillator (TCXO)) with excellent phase noise performance. Base reference frequency 126 can be a sine wave or a distorted square wave that needs to be transmitted through an analog-to-digital clock converter to suit input requirements of ADPLL 100. Thus, ADPLL 100 includes a slicer 124 for the aforementioned purpose. In one or more embodiments, the processing of base reference frequency 126 through slicer 124 may yield $f_{ref}$ 102.

As discussed above, the output of DCO 108, i.e., CKV 114, is divided in frequency through divider 110 (e.g., ripple counter) and the sampled count value 130 input to phase detector 104. Components of the division (e.g., divide by 2, divide by 4, divide by 8 component obtained through the ripple counter implementation of divider 110) is coupled to the input of slicer 124, thereby corrupting the output. The divided components are higher in frequency compared to $f_{ref}$ 102 and have various coupling paths to the victim circuitry (e.g., slicer 124) such as substrate paths, imperfect supply routes and mutual inductance between package bond wires. Whenever the interfering Radio Frequency (RF) signals are close to an integer harmonic frequency of $f_{ref}$ 102, the RF signals are down sampled close to the zero frequency in a non-linear circuit forming slicer 124. A down-converted RF signal acts like an additive interference to the input signal of slicer 124, leading to phase-domain jitter therein. As there is no longer a pure base reference frequency 126 (e.g., a pure sinusoidal wave) being processed through slicer 124, the output of DCO 108 includes spurs that are spurious/undesired frequencies. The spurs are not removed by the low-pass filtering action of ADPLL 100 as the spurs are of lower frequencies compared to the cut-off frequency thereof. The unfiltered spurs, therefore, degrades the performance of DCO 108. The unfiltered spurs are also amplified due to the multiplicative elements in ADPLL 100.

The spurs are present in the reference frequency input due to interference from the divided components of CKV 114, for all values of CKV 114. Only in the case of there being a near-integer relationship between $f_{ref}$ 102 and CKV 114, low frequency spurs are generated that causes performance degradation due to the spurs not being filtered through ADPLL 100. The ADPLL 100 allows for direct frequency modulation capability in which the frequency of DCO 108 is controlled by the frequency deviation derived from data modulation schemes. Under modulation conditions, the output of ADPLL 100 may be a modulated tone, whose frequency spectrum spreads around the output frequency (e.g., CKV 114). Consequently, in such cases, the spurs in the reference frequency input due to coupling from the divided components of the modulated output frequency (e.g., CKV 114) spans a frequency band. In the case of there being a near-integer relationship between $f_{ref}$ 102 and the modulated CKV 114, the spurs in the reference frequency input due to interference from the divided outputs occupies a band including low frequencies that are not filtered through ADPLL 100.

In case of there being a near-integer relationship between CKV 114 and $f_{ref}$ 102 (e.g., CKV=2457 MHz and $f_{ref}$=38.4 MHz, the near-integer relationship therein being 63.984375), the aforementioned components of the integer division through divider 110 (e.g., divide by 2 component, divide by 4 component, divide by 8 component) are also in near-integer relationships with $f_{ref}$ 102. Here, the interfering signal (e.g., divided frequency components of CKV 114) varies in phase with respect to $f_{ref}$ 102 more slowly than when CKV 114 is not in a near-integer relationship (but not a perfect integer relationship) with $f_{ref}$ 102. In the case of a perfect integer relationship between CKV 114 and $f_{ref}$ 102, the phase variation is, obviously, 0.

As discussed above, slicer 124 is configured to convert a sinusoidal wave to a square wave. Threshold values are employed in slicer 124 to select digital state(s) therein. For example, a value of the input signal to slicer 124 that is above a threshold value is assigned a particular digital state. Therefore, the jitter noise in the sliced square wave is caused by the interfering signal (e.g., divided frequency components of CKV 114). As per the aforementioned discussion of threshold and digital state(s), the interference occurring with respect to $f_{ref}$ 102 may, therefore, affect the output of slicer 124 only at the zero-crossing of $f_{ref}$ 102.

Figure 2A:
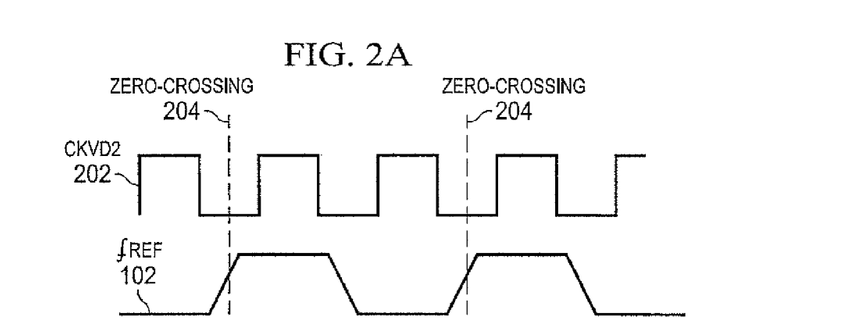
FIG. 2A is an illustrative view of a divided frequency component of the output frequency of the ADPLL of FIG. 1 at zero-crossings of the reference clock frequency input to the ADPLL, when there is a near-integer relationship between the output frequency and the reference clock frequency input.
Figure 2B:
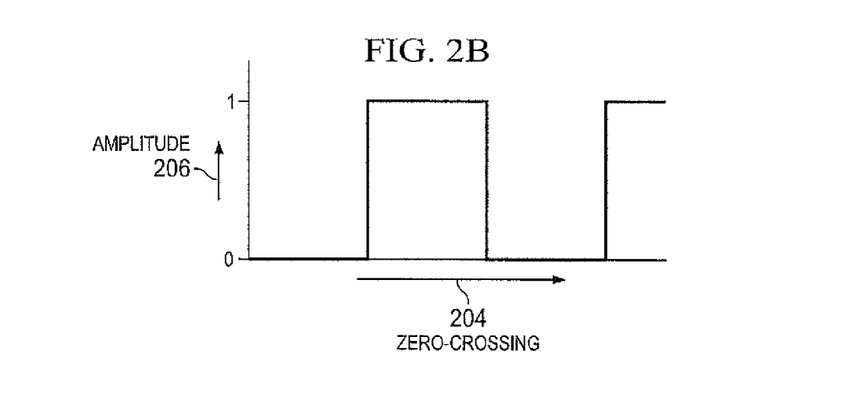
FIG. 2B is another illustrative view of a divided frequency component of the output frequency of the ADPLL of FIG. 1 at zero-crossings of the reference clock frequency input to the ADPLL, when there is a near-integer relationship between the output frequency and the reference clock frequency input.

FIGS. 2A & 2B illustrates the interfering signal amplitude at zero-crossings 204 of $f_{ref}$ 102 in a near-integer relationship between CKV 114 and $f_{ref}$ 102, according to one or more embodiments. The interfering signal here is CKVD2 202, which is the divide by 2 component of CKV 114, as obtained through divider 110. FIG. 2A indicates two instances of amplitude 206 of CKVD2 202 during zero-crossings 204 of $f_{ref}$ 102. Here, amplitude 206 of CKVD2 202 continues to be 0 (e.g., a low state) at a second zero-crossing 204, as indicated. Amplitude 206 increases to 1 (e.g., a high state) after several zero-crossings 204 of $f_{ref}$ 102, following second zero-crossing 204.

Thus, in case of near-integer relationships, the interfering signal varies in phase with respect to $f_{ref}$ 102 slowly. This is because of the amplitude (e.g., amplitude 206) of the interfering signal (e.g., CKVD 2 202) not changing significantly over a number of zero-crossings 204 of $f_{ref}$ 102. Also, the number of interfering signal periods within continuous zero-crossings 204 of a rising/falling edge of $f_{ref}$ 102 may be a near-integer, whose slowly-varying fractional part (close to 1) contributes to the slow variation of edges at the output of slicer 124. FIG. 2A also indicates the slow variation with amplitude 206 of CKVD2 202 continuing to be 0 for two successive zero-crossings 204. As shown in FIG. 2B, amplitude 206 of CKVD2 202 is sampled at zero-crossings 204 of $f_{ref}$ 102. The sampled amplitude (e.g., amplitude 206) varies as a square wave with a low frequency at zero-crossings 204 of $f_{ref}$ 102.

In the example discussed above where CKV 114 is 2457 MHz and $f_{ref}$ 102 is 38.4 MHz, the spur component at the output of slicer output 124 due to CKVD2 202 is at a frequency of 300 kHz, as (2457/2) MHz (or, 1228.5 MHz) is 300 kHz away from a harmonic of 38.4 MHz (here, 1228.8 MHz is the $32^{nd}$ harmonic of 38.4 MHz). In other words, CKVD2 202 is down-sampled by $f_{ref}$ 102 to 300 kHz in slicer 124 to be a spur at 300 kHz. In case of the RF interfering signal not being a pure sine wave, the spur component has harmonics associated therewith (e.g., 600 KHz, 1.2 MHz, 1.8 MHz). Similarly with CKVD4 (divide by 4 component), and CKVD8 (divide by 8 component) as the interfering signals, the spur component associated therewith varies with a frequency of 150 kHz and 75 kHz respectively. Again, these spur components have harmonics associated therewith. It can be seen that 614.4 MHz and 307.2 MHz are exact integer multiples of $f_{ref}$ 102. Therefore, considering the 150 kHz and the 75 kHz spurs discussed above, it can be said that CKVD4 and CKVD8 are 150 kHz and 75 kHz away from the appropriate exact harmonics of (2457/4) MHz (or, 614.25MHz) and (2457/8) MHz (or, 307.125 MHz) respectively.

In one or more embodiments, ADPLL 100 acts as a low-pass filter for the reference phase noise. In the example discussed above, if ADPLL 100 has a loop cut-off frequency of 200 kHz, spur components (and harmonics) associated with CKVD2 202 are attenuated considerably as the respective fundamental frequency associated therewith is 300 kHz. In case of CKVD4 and CKVD8, ADPLL 100 does not reject the fundamental frequencies of the spurs associated therewith, viz. 150 kHz and 75 kHz respectively. In case if there is no near-integer relationship between CKV 114 and $f_{ref}$ 102 (e.g., CKV 114 being 2480 MHz instead of 2457 MHz, and $f_{ref}$ 102 being the same 38.4 MHz), the amplitude of the interfering signal varies at a higher frequency than when there is a near-integer relationship. In the aforementioned case of CKV 114 being 2480 MHz instead of 2457 MHz, the spur associated with CKVD2 202 varies at a frequency (e.g., in the order of MHz) much higher than 300 KHz.

Figure 3:
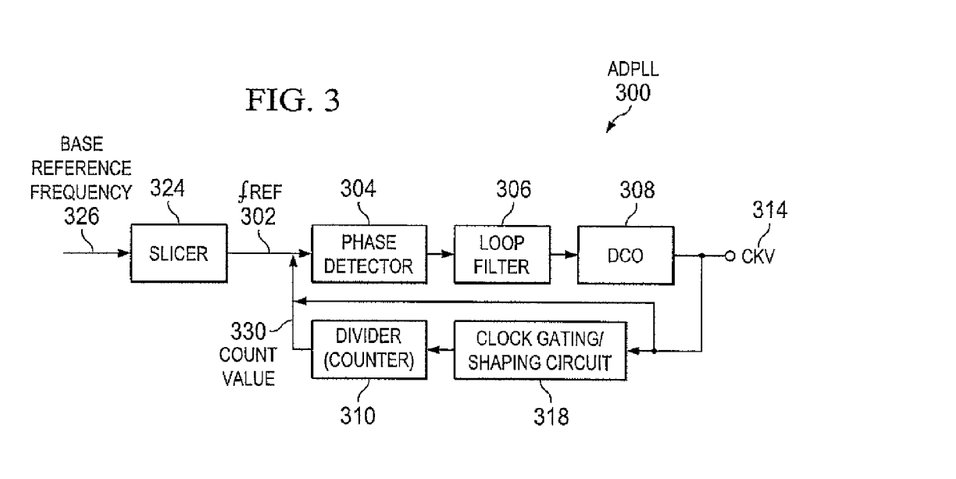
FIG. 3 is a schematic view of an ADPLL with a clock gating/shaping circuit, according to an embodiments.

FIG. 3 shows an ADPLL 300 with clock gating/shaping circuit 318, according to one or more embodiments. Base reference frequency 326, slicer 324, loop filter 306, DCO 308, divider 310, count value 330, phase detector 304 and $f_{ref}$ 302 are analogous to base reference frequency 126, slicer 124, loop filter 106, DCO 108, divider 110, count value 130, phase detector 104 and $f_{ref}$ 102 associated with ADPLL 100 shown in FIG. 1. In one or more embodiments, clock gating/shaping circuit 318 is placed in the feedback path of ADPLL 300 prior to divider 310. Clock gating/shaping circuit 318 is configured to enable gating of CKV 314 for one or more clock cycles thereof falling between $f_{ref}$ 302 such that the phase variation between the divided frequency components and $f_{ref}$ 302 is faster than in ADPLL 100, where there is no clock gating/shaping circuit 318, the input to clock gating/shaping circuit 318 (or, the output of DCO 308) may serve as an input to phase detector 304

Figure 4:
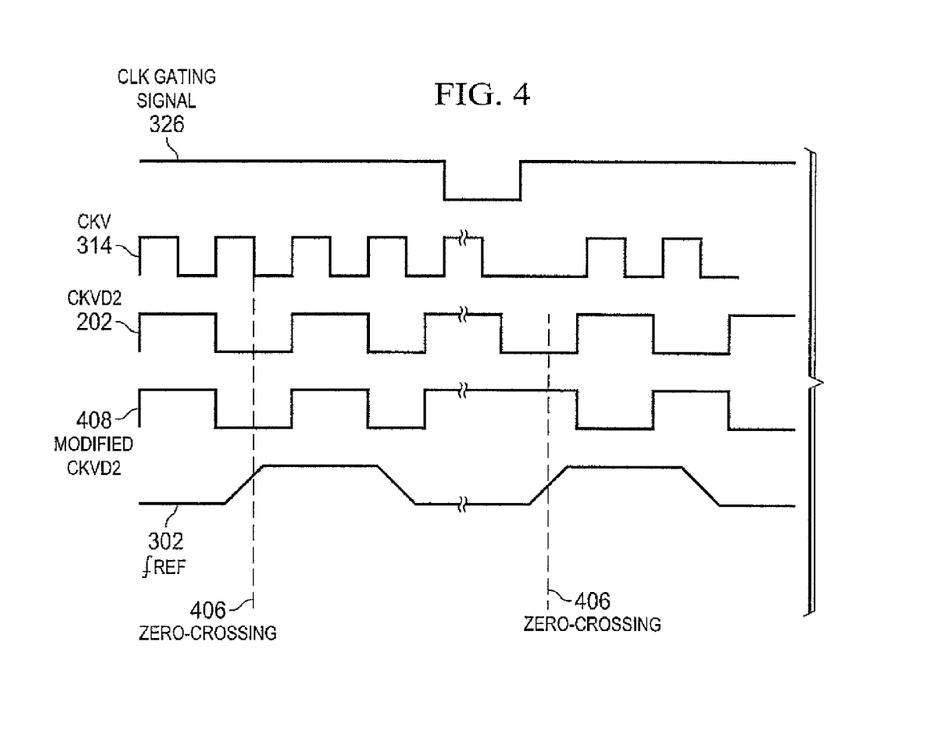
FIG. 4 is an illustrative view of the phase variation between a divided frequency component of the gated output frequency of the ADPLL of FIG. 3 and the reference clock frequency input thereto.

Again, analogous to FIG. 1, CKV 314 is the output (in frequency) of DCO 308, which may be divided through divider 310 (e.g., ripple counter) to generate divided component(s) thereof. FIG. 4 shows the phase variation between a gated divided component of CKV 314 (viz., modified CKVD2 408) and $f_{ref}$ 302, according to one or more embodiments. As discussed above with regard to FIG. 1, the phase variation between the interfering signal (e.g., a divided component of CKV 114 (e.g., CKVD2 202)) and $f_{ref}$ 102 in ADPLL 100 is very slow as the amplitude may change a value thereof only after several zero-crossings. In contrast, the phase variation between modified CKVD2 408 and $f_{ref}$ 302 is very fast. FIG. 4 also shows CKVD2 202 as a reference.

As shown in FIG. 4, due to the gating of one clock cycle of CKV 314 prior to a zero-crossing 406 of $f_{ref}$ 302 through clock (CLK) gating signal 402, the amplitude of modified CKVD2 408 may change from 0 (e.g., a low state) for a zero-crossing 406 of $f_{ref}$ 302 to 1 (e.g., a high state) for the immediate next zero-crossing 406. The amplitude may then again change to 0 for the next zero-crossing 406 (not shown). Although the 0-1 switching of the amplitude of modified CKVD2 408 between successive zero-crossings 406 of $f_{ref}$ 302 does not always occur due to the dependence thereof on the number of clock cycles of CKV 314 for which the gating is implemented and/or the number of clock cycles of CKV 314 within $f_{ref}$ 302, the amplitude of modified CKVD2 408 may change at a high frequency with respect to $f_{ref}$ 302. The spur due to modified CKVD2 408 is therefore relocated to a higher frequency, which can be filtered by ADPLL 300, whose loop cut-off frequency is much lower than the spur frequency.

Irrespective of the interfering mechanism, the spur due to the divided components of CKV 314 is rejected by ADPLL 300 loop. The details associated with clock gating/shaping circuit 318 is discussed with reference to an example implementation shown in FIG. 5 below. In an analogous example to the example discussed above, with CKV 314 being 2457 MHz and $f_{ref}$ 302 being 38.4 MHz, the phase of the spur component due to modified CKVD2 408 (i.e., the divide by 2 component of CKV 314) is relocated to a frequency that is close to 19.2 MHz (or, 0.5 $f_{ref}$). This is due to the approximate 180 degree change in phase between modified CKVD2 408 and $f_{ref}$ 302, in response to gating one clock of CKV 314 in one period of $f_{ref}$ 102. Likewise, the spur components due to CKVD4 (divide by 4 component) and CKVD8 (divide by 8 component) may be relocated to frequencies close to 9.6 (or, 0.25 $f_{ref}$) MHz and 4.8 MHz (or, 0.125 $f_{ref}$) respectively.

In contrast to ADPLL 100, where the spur components due to CKVD2 202, CKVD4 (divide by 4 component) and CKVD8 (divide by 8 component) are 300 kHz, 150 kHz and 75 kHz in frequency respectively, the spur components in ADPLL 300 due to the divided frequency components of CKV 314 are of high frequency, which allows for easy rejection by ADPLL 300. As discussed above, a ripple counter may be used in the realization of divider 310. For example, the ripple counter may include multiple stages therein, with each stage being configured to generate a divided frequency component that is equal to CKV 314 scaled down by $2^N$ (where N=1, 2, 3 . . . M for the $1^{st}$, $2^{nd}$, $3^{rd}$ . . . $M^{th}$ stage). Here, the gating of one or more clock cycle(s) of CKV 314 alone may be required, which are done at the clock input of the first stage of the ripple counter (i.e., the stage associated with the divide by $2^1$ component, or, CKVD2 202, which is gated to manifest as modified CKVD2 408). The derived divided clock frequency components (e.g., divide by 2 component, divide by 4 component, divide by 8 component) are changed automatically thereupon.

It is obvious to one skilled in the art that the clock gating can be applied to any of the divided components of CKV 314, depending on whether ADPLL 300 is able to filter a particular spur component or not. For example, the spur due to CKVD8 may be the only component that ADPLL 300 is unable to filter there through. Although, as discussed above, gating of one or more clock cycles of CKV 314 alone suffices to relocate the spur due to CKVD8 to a frequency outside the cut-off frequency of ADPLL 300, one or more clock cycles CKVD2/CKVD4 are also gated to achieve the same goal. Here, gating is done at the CLK input to a stage of the ripple counter discussed above that is associated with CKVD2/CKVD4. Now, CKVD2/CKVD4, generated from CKV 314, is interpreted as the output frequency of ADPLL 300, and stages of the ripple counter (other than the stage associated with CKVD2/CKVD4) may be clocked at CKVD2 /CKVD4 instead of CKV 314. Also, $f_{ref}$ 302 is re-sampled with a falling/rising edge of CKVD2/CKVD4 instead of CKV 314. The aforementioned modifications and interpretations are within the scope of the exemplary embodiments. The re-sampling of $f_{ref}$ 302 will be discussed in detail below with reference to FIG. 5.

Figure 5:
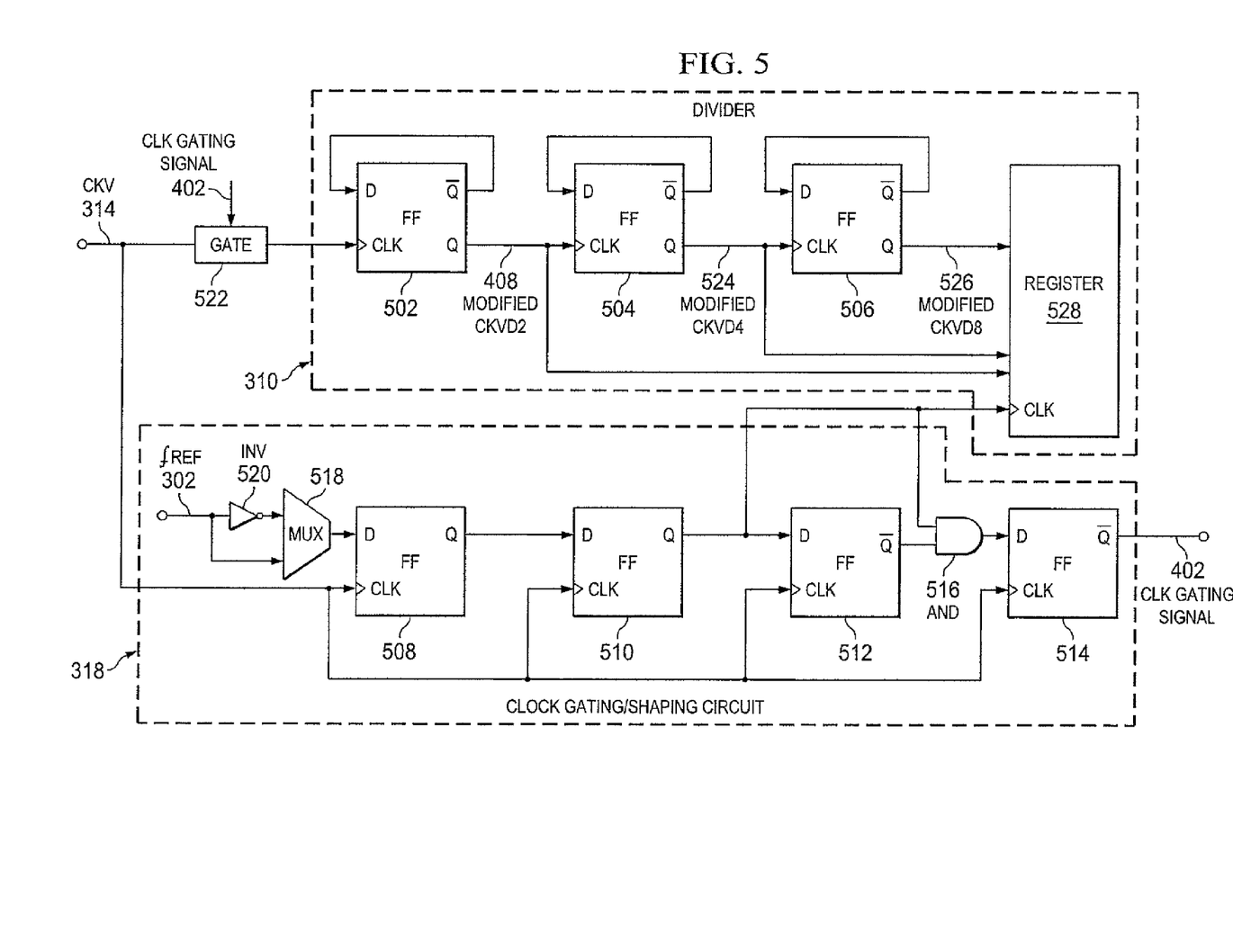
FIG. 5 is a schematic view of the clock gating/shaping circuit of the ADPLL of FIG. 3 coupled to a divider of the ADPLL.

FIG. 5 shows a clock gating/shaping circuit 318 coupled to divider 310 of ADPLL 300 in the feedback path thereof, according to one or more embodiments. Divider 310 includes one or more flip-flops (FFs), each of which forms a stage therein. FIG. 5 shows a three-stage divider 310 including FF 502, FF 504, and FF 506. FF 502, FF 504 and FF 506 are delay (D) flip-flops. The D inputs of each of FF 502, FF 504 and FF 506 are configured to be coupled to the corresponding complementary ($\overline{Q}$) outputs thereof and the Q outputs of FF 502 and FF 504 may be configured to be the clock (CLK) inputs to FF 504 and FF 506. The CLK input to FF 502 may be the gated version (e.g., gated through gate 522) of CKV 314. As a D-flip-flop holds a Q input thereof until a next rising edge (or, falling edge, depending on the implementation) of the CLK input thereof, the Q outputs of FF 502, FF 504, and FF 506 is the divide by 2 frequency component (i.e., modified CKVD2 408), the divide by 4 frequency component (i.e., modified CKVD4 524), and the divide by 8 frequency component (i.e., modified CKVD8 526) of CKV 314 respectively.

In the example embodiment shown in FIG. 5, each of the divide by 2, divide by 4 and divide by 8 outputs, i.e., modified CKVD2 408, modified CKVD4 524 and modified CKVD8 526 is input to a register 528 configured to store a current value of the counter associated with divider 310 and a previous value thereof. It is obvious to one skilled in the art that divider 310 may include more than three stages. Also, register 528 includes a separate register for storing the current value of the current and a separate register for storing the previous value thereof. In one or more embodiments, the counter value is sampled at a rising edge or a falling edge of CKV 314.

As CKV 314 and $f_{ref}$ 302 are asynchronous with respect to one another, $f_{ref}$ 302 needs to be re-sampled with an edge (falling/rising) of CKV 314 to detect a positive/negative (preferably positive) edge thereof. As the counter associated with divider 310 changes a state thereof at each rising edge of CKV 314, the falling edge of CKV 314 is utilized for the re-sampling purpose. To reduce metastability during re-sampling, a D flip-flop, viz. FF 508, is cascaded with another D flip-flop, viz. FF 510 (and/or other custom made flip-flops having small metastability windows). In one or more embodiments, the control input, i.e., D input, to FF 508 is $f_{ref}$ 302 and the CLK input may be CKV 314. As FF 508 and FF 510 are cascaded, the D input to FF 510 is the Q output of FF 508 and the CLK input to FF 510 is CKV 314. Thus, it is possible to enable edge alignment of the re-sampled version of $f_{ref}$ 302 with CKV 314. In an embodiment, the re-sampled version of $f_{ref}$ 302 with CKV 314 may be used to generate clock gating signal for divider 310.

The Q output of FF 510, which is the re-sampled version of $f_{ref}$ 302, is given as the CLK input to register 528 to control a timing therein. For re-sampling $f_{ref}$ 302 at the falling edge/rising edge of CKV 314, a multiplexer (MUX 518) is provided to select a corresponding $f_{ref}$ 302/inverted $f_{ref}$ 302 (e.g., inverted through inverter (INV) 520) to be the D input of FF 508. The control input of MUX 518 is the programmable register 528 value associated with the appropriate form (e.g., falling/rising edge of CKV 314) of re-sampling.

As discussed above, in a communication system (e.g., wireless communication system such as wireless LAN/wireless personal area network (WPAN)), ADPLL 300 generates CKV 314 as the carrier frequency. The wireless communication system generates a number of channel frequencies (e.g., associated with CKV 314). For example, in a receiver, ADPLL 300 is configured to select a channel frequency of reception. Depending on whether there exists a near-integer relationship between CKV 314 and $f_{ref}$ 302, the clock gating is enabled or disabled through a firmware associated with ADPLL 300. The firmware is stored in a Read-Only Memory (ROM) or a Random Access Memory (RAM) associated with ADPLL 300. All components of ADPLL 300 may be part of an integrated circuit, with everything except for the source of base reference frequency 326 being part of the same chip.

In one or more embodiments, as clock gating/shaping circuit 318 is configured to enable gating one or more clock cycles of CKV 314, count value 330 associated with the counter of ADPLL 300 is modified. Count value 330/count state is sampled by the re-sampled reference clock (Q output of FF 510) and the difference between the sampled count value and the expected count value given by the desired carrier frequency may be obtained as the phase error output. The counter is also used to generate signals that serve as clocks for various digital synchronous operations. Appropriate phase compensation at phase detector 304 is performed to compensate for the modified count value. The aforementioned phase compensation occurs in real-time. As clock gating is deterministic (e.g., fixed number of clocks gated in a reference period), the change in count value 330 is known. At phase detector, the sampled count value is appropriately adjusted by the exact number of counts for which the clock is gated and then is compared with expected count value to obtain the phase error. For example, in the case of counter being stalled for one (e.g., CKV 314) count every reference clock, the measured count value (e.g., count value 330) may need to be incremented by one. If the phase adjustment is not done, ADPLL 300 locks to a different frequency (e.g., a higher frequency) from the desired frequency.

To enable gating of one or more clock cycles of CKV 314, CLK gating signal 402 may be generated. The Q output of FF 510 is given to the D input of another D flip-flop, viz. FF 512. FF 512 also has CKV 314 as the CLK input. Thus, the Q output of FF 512 lags the Q output of FF 510, i.e., the re-sampled $f_{ref}$ 302, by one more CKV 314 clock cycle. In one or more embodiments, when the $\overline{Q}$ output (or, inverted output (Q)) of FF 512 is logically AND-ed (e.g., through AND gate 516) with the Q output of FF 510, a pulse with a width of a CKV 314 clock cycle is generated as the output. Thus, FF 512 is construed as the delay logic and the AND gate 516 is construed as the pulse generation logic in the generation of CLK gating signal 402.

The aforementioned pulse is inverted to generate CLK gating signal 402. CLK gating signal 402 is configured to cause a gating near the falling edge of $f_{ref}$ 302. Inversion is accomplished through providing the pulse output of AND gate 516 as the D input of another FF 514, and then obtaining the $\overline{Q}$ output as CLK gating signal 402. Again, the CLK input to FF 514 may be CKV 314. The width of CLK gating signal 402 is equal to a CKV 314 clock cycle. In one or more embodiments, CLK gating signal 402 is high (e.g., a "1" state) for all but one clock cycle of CKV 314 within $f_{ref}$ 302, as shown in FIG. 4, and is low (e.g., a "0" state) for other clock cycles of $f_{ref}$ 302.

Figure 6:
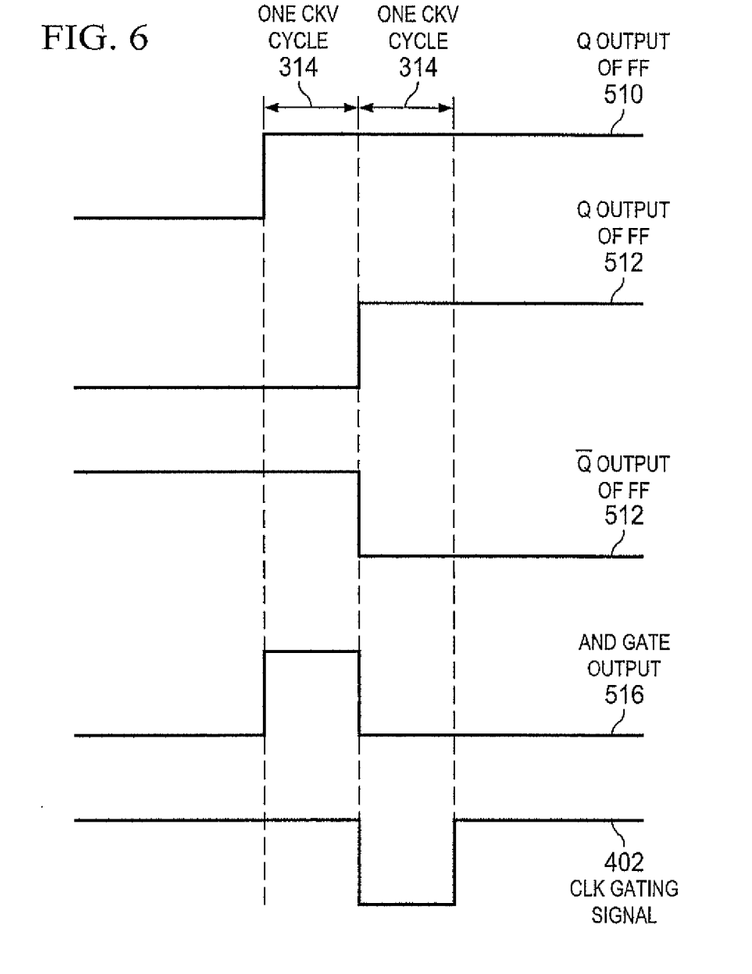
FIG. 6 is an illustrative view of the generation of a clock gating signal through the clock/gating shaping circuit of the ADPLL of FIG. 3.

FIG. 6 illustrates the generation of CLK gating signal 402, according to one or more embodiments. The Q output of FF 510 is shown as a reference. The Q output of FF 510 is given as the D input of FF 512. Thus, the Q output of FF 512 lags behind the Q output of FF 510 by one CKV 314 clock cycle, as shown in FIG. 6. The $\overline{Q}$ output of FF 512 is also shown in FIG. 6 as the inverse of the Q output thereof. Now, as the Q output of FF 510 and the $\overline{Q}$ output of FF 512 are the inputs to AND gate 516, the output of AND gate 516 is shown as a pulse with a width equal to one CKV 314 clock cycle. FIG. 6 also shows the inverted pulse, i.e., CLK gating signal 402, which may be the $\overline{Q}$ output of FF 514. As seen in FIG. 6, CLK gating signal 402 is further delayed by one clock cycle of CKV 314 as the output of AND gate 516 is applied to the Q input of FF 514, the $\overline{Q}$ output of which is CLK gating signal 402. In one or more embodiments, CLK gating signal 402 is further delayed so that the gating is separated in time from the re-sampled edge of $f_{ref}$ 302 to avoid any possible instability, The pulse, as represented by CLK gating signal 402, appears during every $f_{ref}$ 302. As gating a clock cycle of CKV 314 may not be appropriate at $f_{ref}$ 302 edges (e.g., zero-crossing 406) due to possible instability, the pulse output of AND gate 516 may be input to FF 514 to further delay the pulse by a CKV 314 clock cycle. Thus, CLK gating 402 signal causes the phase associated with modified CKVD2 408 at zero-crossings 406 of $f_{ref}$ 302 to change at a faster rate (e.g., approximately 180 degrees) than when there is no CLK gating, as shown in FIG. 4. FIG. 4 shows approximately 4 clock cycles of CKV 314 within $f_{ref}$ 302 merely for convenience of illustration. As seen in the example discussed above, there are approximately 64 clock cycles of CKV 314 within $f_{ref}$ 302. The number of CKV 314 clock cycles within $f_{ref}$ 302 varies based on the relationship therebetween. The logic (e.g., resampling logic, delay logic, pulse generation logic, the form of CLK gating signal 402) involved in clock gating/shaping circuit 318 and/or the delay in CLK gating signal 402 can be varied. All such variations are within the scope of the exemplary embodiments.

As further shown in FIG. 4, modified CKVD2 408 is analogous to CKVD2 202 at all clock cycles prior to clock gating (e.g., through CLK gating signal 402), which causes a clock to the counter discussed above to be swallowed once every $f_{ref}$ 302. This changes the phase of modified CKVD2 408 with respect to $f_{ref}$ 302 at every zero-crossing 406 thereof. For example, as shown in FIG. 4, the amplitude of modified CKVD2 408 is shown to be "0" (e.g., a low state) at the first zero-crossing 406. Then, the amplitude is "1" (e.g., a high state) at the second zero-crossing 406 due to the aforementioned clock gating. The amplitude at the next zero-crossing 406 may then be expected due to be "0" (e.g., a low state) again.

Again, as discussed above, the sampled value of the counter is used by ADPLL 300 for locking purposes. As the abovementioned clock gating is performed in a controlled manner (e.g., the counter is stalled once every $f_{ref}$ 302), the expected change in the count value is known, thereby enabling an appropriate adjustment thereof at phase detector 304. In an embodiment, more than one clock cycle of CKV 314 is gated. In the abovementioned example of having approximately 64 CKV 314 clock cycles within $f_{ref}$ 302, an odd number of CKV 314 clock cycles (e.g., 3 clock cycles) therein are gated. Gating an odd number of clock cycles is preferable to gating an even number of clock cycles as the approximate 180 degrees phase shift of the amplitude of modified CKVD2 408 between successive zero-crossings 406 of $f_{ref}$ 302 is possible therewith. Here, the Q output of FF 510 is delayed by more than one clock cycle of CKV 314. In other words, the clock gating is performed (e.g., through CLK gating signal 402) a few CKV 314 clock cycles away from an edge of $f_{ref}$ 302.

In the example discussed above, it is shown that gating CKV 314 for one or more clock cycles may change the phase relationship between modified CKVD2 408 and $f_{ref}$ 302 at zero-crossings 406 of $f_{ref}$ 302. Thus, clock gating of CKV 314 accounts for mitigation of the effects due to spur frequencies associated with divided components frequency components of CKV 314 (e.g., modified CKVD2 408, modified CKVD4 526, modified CKVD8 528), as the aforementioned spur frequencies are filtered through ADPLL 300.

Figure 7:
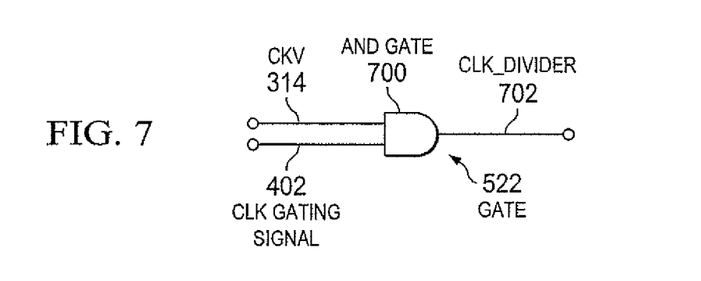
FIG. 7 is a schematic view of an example gating logic configured to enable clock gating in the ADPLL of FIG. 3.

In an embodiment, CLK gating signal 402 is applied to gate 522, as shown in FIG. 5. FIG. 7 shows gate 522 as an AND gate 700. Analogous to FIG. 5, the inputs to AND gate 700 may be CKV 314 and CLK gating signal 402. When CLK gating signal 402 is "1" (e.g., a high state), CKV 314 serves as the CLK input to FF 502. When CLK gating signal 402 becomes "0" (e.g., a low state), the controlled clock gating is enabled, which then proceeds as discussed above. The output of AND gate 700 is shown in FIG. 7 as CLK_DIVIDER 702. Variations of the gating logic associated with gate 522 are within the scope of the exemplary embodiments. It is noted that FIG. 5 is an example implementation of the abovementioned controlled clock gating. Other implementations may be devised, which may utilize the concepts discussed herein. Such implementations are within the scope of the exemplary embodiments.

Again as discussed above, ADPLL 100 can be employed in a wireless transmitter or receiver. When locked to a near-integer channel, a Local Oscillator (LO) clock associated with the output frequency of ADPLL 100 may include spurs. Consequently, the wireless transmitter may suffer from a degraded phase noise and/or a degraded transmitter Error Vector Magnitude (EVM). Thus, it may be difficult to meet the transmitter EVM for near-integer channels. In one or more embodiments, the clock gating in ADPLL 300 shifts the spurs to a high frequency that is filtered there through. Moreover, clock gating/shaping circuit 318 is programmable through a firmware associated with ADPLL 300, as discussed above. In one or more embodiments, due to the abovementioned clock gating in ADPLL 300, the transmitter EVM for a near-integer channel is improved even when compared to a non-near integer channel. Thus, ADPLL 300 is configured to lock to any channel, independent of the near-integer relationship with $f_{ref}$ 302.

Figure 8A:
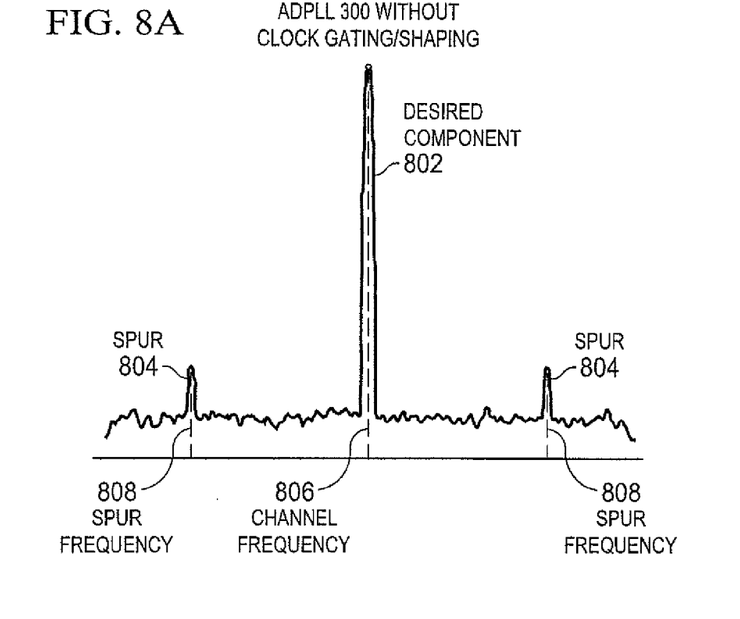
FIG. 8A is an illustrative view of a near-integer channel spur mitigation in the ADPLL of FIG. 3.
Figure 8B:
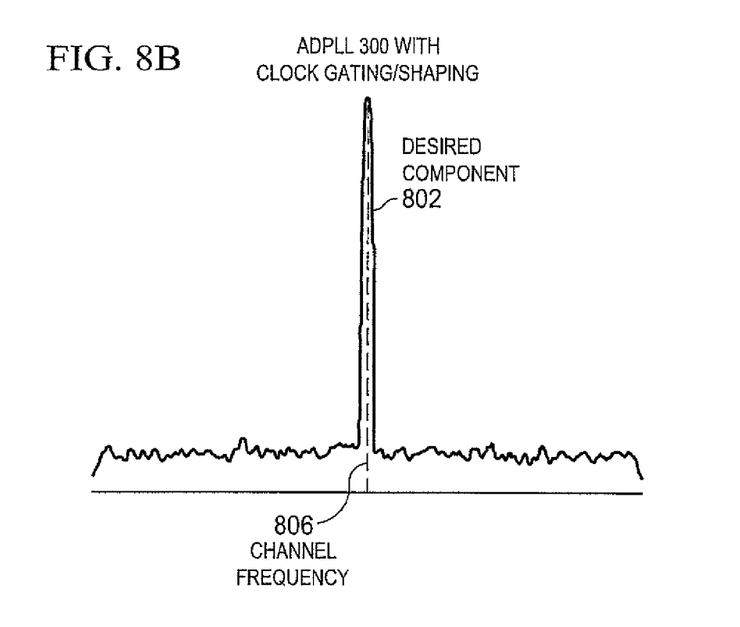
FIG. 8B is an illustrative view of another near-integer channel spur mitigation in the ADPLL of FIG. 3.

FIGS. 8A and 8B illustrate near-integer channel spur mitigation in ADPLL 300 due to clock gating/shaping circuit 318, according to one or more embodiments. When clock gating/shaping circuit 318 is disabled as in FIG. 8A (e.g., by disabling the delay logic and/or the pulse generation logic through a firmware associated with ADPLL 300) in ADPLL 300, spurs 804 are seen (e.g., at a low spur frequency 808), for example, through a spectrum analyzer configured to provide a representation of spectra associated with the output of ADPLL 300, in addition to the desired component 802 (e.g., seen at channel frequency 806). When clock gating/shaping circuit 318 is enabled in ADPLL 300 as in FIG. 8B, the relocation of spurs 804 to a higher frequency conveniences filtering thereof through ADPLL 300. Thus, spurs 804 is absent in ADPLL 300, in which clock gating/shaping circuit 318 is enabled.

Figure 9:
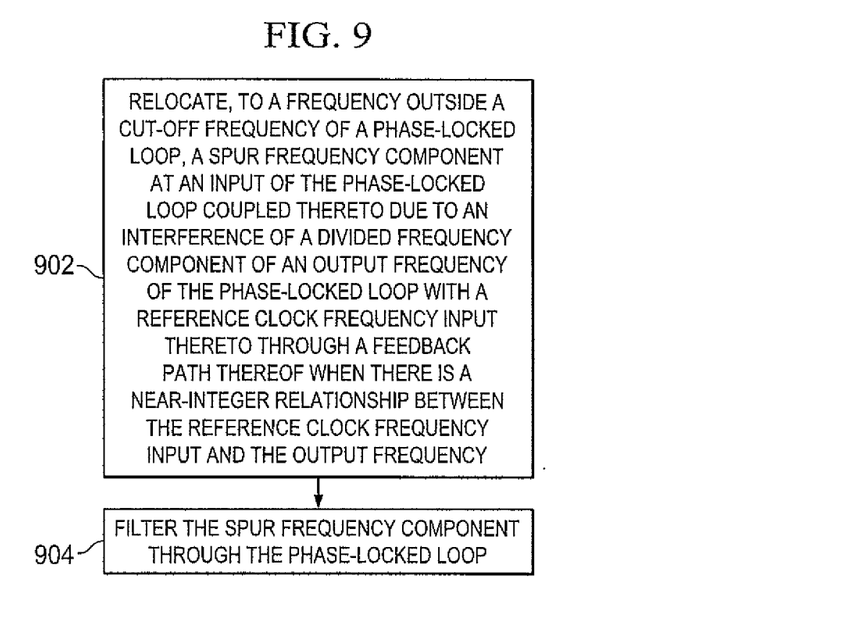
FIG. 9 is a process flow diagram detailing the operations involved in a method of near-integer channel spur mitigation in the ADPLL of FIG. 3.

FIG. 9 illustrates a process flow diagram detailing the operations involved in a method of near-integer channel spur mitigation in ADPLL 300, according to one or more embodiments. Operation 902 involves relocating, to a frequency outside a cut-off frequency of ADPLL 300, a spur frequency component at an input of ADPLL 300 coupled thereto due to an interference of a divided frequency component of an output frequency of ADPLL 300 with a reference clock frequency input thereto through a feedback path thereof when there is a near-integer relationship between the reference clock frequency input and the output frequency. Relocating the spur frequency component includes accelerating a phase variation of the divided frequency component with respect to the reference clock frequency input at successive zero-crossings of the reference clock frequency input through gating at least one clock cycle of the output frequency during every clock cycle of the reference clock frequency input, the at least one clock cycle being configured to be an odd number. Operation 904 then involves filtering the spur frequency component through ADPLL 300.

Although the present embodiments have been described with reference to specific example embodiments (e.g., an ADPLL), it will be evident that various modifications and changes may be made to these embodiments without departing from the broader spirit and scope of the various embodiments. For example, the various systems, devices, apparatuses, and circuits, etc. described herein may be enabled and operated using hardware circuitry, firmware, software or any combination of hardware, firmware, or software embodied in a machine readable medium. The various electrical structures and methods may be embodied using transistors, logic gates, application specific integrated (ASIC) circuitry or Digital Signal Processor (DSP) circuitry. The concepts involved herein may apply to any phase-locked loop (PLL), wherein an integer division of the oscillator clock may interfere with the reference signal through various coupling paths to cause a spurious component therein and/or or phase noise degradation thereto.

In addition, it will be appreciated that the various operations, processes, and methods disclosed herein may be embodied in a machine-readable medium or a machine accessible medium compatible with a data processing system, and may be performed in any order. Accordingly, the specification and drawings are to be regarded in an illustrative rather than a restrictive sense.

What is claimed is:

1. A method comprising:
    relocating, to a frequency outside a cut-off frequency of a phase-locked loop, a spur frequency component at an input of the phase-locked loop coupled thereto due to an interference of a divided frequency component of an output frequency of the phase-locked loop with a reference clock frequency input thereto through a feedback path when there is a near-integer relationship between the reference clock frequency input and the output frequency, wherein relocating the spur frequency component comprises:
        accelerating a phase variation of the divided frequency component with respect to the reference clock frequency input at successive zero-crossings of the reference clock frequency input through gating at least one clock cycle of the output frequency during every clock cycle of the reference clock frequency input, the at least one clock cycle being configured to be an odd number.

2. The method of claim 1, wherein gating the at least one clock cycle of the output frequency once every clock cycle of the reference clock frequency input further comprises:
    generating a clock gating signal through a clock gating circuit associated with the phase-locked loop; and
    stalling a counter associated with at least one of the output frequency and the divided frequency component thereof for the at least one clock cycle corresponding to the output frequency during every clock cycle of the reference clock frequency input through the clock gating signal.

3. The method of claim 1, further comprising one of enabling and disabling the gating of the at least one clock cycle of the output frequency based on a presence and an absence of the near-integer relationship between the reference clock frequency input and the output frequency through a firmware associated with the phase-locked loop.

4. The method of claim 2, further comprising performing a phase compensation in the phase-locked loop to compensate for a modified count value associated with the stalling of the counter for the at least one clock cycle corresponding to the output frequency during every clock cycle of the reference clock frequency input through the clock gating signal.

5. The method of claim 2, further comprising:
    re-sampling the reference clock frequency input with one of a falling edge and a rising edge of the output frequency; and
    generating the clock gating signal through the clock gating circuit based on the re-sampled reference clock frequency input.

6. The method of claim 5, further comprising:
    applying the clock gating signal to a gating logic associated with a clock input to the counter, the gating logic also being configured to receive the output frequency of the phase-locked loop; and
    configuring the gating logic to stall the counter for the at least one clock cycle of the output frequency based on a state of the clock gating signal.

7. The method of claim 5, comprising re-sampling the reference clock frequency input through a cascade of at least two flip-flops to reduce metastability due to asynchronicity between the reference clock frequency input and the output frequency.

8. The method of claim 5, wherein generating the clock gating signal through the clock gating circuit based on the re-sampled reference clock frequency input comprises:
    delaying the re-sampled reference clock frequency input for the at least one clock cycle of the output frequency; and
    obtaining the clock gating signal based on the re-sampled reference clock frequency input and the delayed re-sampled reference clock frequency input
    through an appropriate logic of the clock gating circuit provided therefor.

9. A phase-locked loop comprising:
    a phase detector configured to receive a reference clock frequency input, a count value of a number of clock cycles of an output frequency of the phase-locked loop and a fractional count value associated with a fractional number of clock cycles of the output frequency, to sample the count value and the fractional count value at every clock cycle of the reference clock frequency input, to calculate a difference between the sampled count value and an expected count value derived from a relation between the output frequency and the reference clock frequency input, and to output a phase error associated with the difference therebetween;
    a divider, coupled to the phase detector and configured to operate on the output frequency, to generate a divided frequency component of the output frequency, to count clock cycles associated with the output frequency, and to feed the count value to the phase detector;
    a clock gating circuit, coupled to the divider and configured to enable gating of at least one clock cycle of the output frequency configured to be operated on by the divider during every clock cycle of the reference clock frequency input when there is a near-integer relationship between the output frequency and the reference clock frequency input through a clock gating signal generated therein,
        wherein the gating is configured to effect relocation of a spur frequency component at an input of the phase-locked loop coupled thereto due to an interference of the divided frequency component with the reference clock frequency input to a frequency outside the cut-off frequency of the phase-locked loop through speeding up a phase variation of the divided frequency component with respect to the reference clock frequency input at successive zero-crossings thereof;
    a loop filter configured to receive the phase error from the phase detector, to generate a control signal based on the phase error, and to filter the spur frequency component; and
    a control oscillator configured to control the output frequency of the phase-locked loop based on the control signal from the loop filter, the control oscillator being coupled to the clock gating circuit and the fractional count value being obtained through processing the output frequency from the control oscillator.

10. The phase-locked loop of claim 9,
wherein the divider is a counter configured to generate the divided frequency component as the output frequency scaled down by $2^N$,
wherein $N \geq 1$, and
wherein the counter is stalled for at least one clock cycle corresponding to the output frequency during every clock cycle of the reference clock frequency input through the clock gating signal, the at least one clock cycle being configured to be an odd number.

11. The phase-locked loop of claim 9, further comprising a firmware associated therewith configured to one of enable and disable the gating of the at least one clock cycle of the output frequency based on a presence and an absence of the near-integer relationship between the reference clock frequency input and the output frequency,
wherein the firmware is stored in one of a Read-Only Memory (ROM) and a Random Access Memory (RAM) associated with the phase-locked loop.

12. The phase-locked loop of claim 10, wherein a modified count value associated with the stalling of the counter for the at least one clock cycle corresponding to the output frequency during every clock cycle of the reference clock frequency input through the clock gating signal is compensated for at the phase detector.

13. The phase-locked loop of claim 10, further comprising a re-sampling logic configured to re-sample the reference clock frequency input with one of a falling edge and a rising edge of the output frequency and to enable generation of the clock gating signal through the clock gating circuit.

14. The phase-locked loop of claim 10, further comprising a gating logic associated with a clock input to the divider and configured to receive the clock gating signal and the output frequency of the phase-locked loop as inputs thereof,
wherein the gating logic is configured to stall the counter for the at least one clock cycle of the output frequency based on a state of the clock gating signal.

15. The phase-locked loop of claim of claim 13, wherein the re-sampling logic utilizes a cascade of at least two flip-flops to reduce metastability due to asynchronicity between the reference clock frequency input and the output frequency.

16. The phase-locked loop of claim of claim 13, wherein the clock gating circuit further comprises an appropriate logic configured to:
delay the re-sampled reference clock frequency input for the at least one clock cycle of the output frequency; and
obtain the clock gating signal based on the re-sampled reference clock frequency input and the delayed re-sampled reference clock frequency input.

17. A circuit comprising:
a delay logic configured to receive a re-sampled version of a reference clock frequency input to a phase-locked loop and to delay the re-sampled version by at least one clock cycle of an output frequency of the phase-locked loop, a divided frequency component of which is configured to be fed back as another input thereto, the at least one clock cycle being configured to be an odd number,
wherein the delay logic comprises at least one flip-flop clocked by an output frequency of the phase-locked loop,
wherein the re-sampled version is generated through a re-sampling logic, associated with the phase-locked loop and configured to re-sample the reference clock frequency input with one of a falling edge and a rising edge of the output frequency; and
a pulse generation logic configured to generate a clock gating signal based on the re-sampled version of the reference clock frequency input and the delayed re-sampled version thereof,
wherein the clock gating signal is configured to change to a second constant state thereof for a time interval corresponding to the delay between the re-sampled version of the reference clock frequency input and the delayed re-sampled version thereof within every clock cycle of the reference clock frequency input from a first constant state corresponding to all other time intervals therein,
wherein the clock gating signal is further configured to enable gating of the at least one clock cycle of the output frequency of the phase-locked loop during every clock cycle of the reference clock frequency input when there is a near-integer relationship between the output frequency and the reference clock frequency input, and
wherein the gating is configured to effect relocation of a spur frequency component at an input of the phase-locked loop coupled thereto due to an interference of the divided frequency component of the output frequency with the reference clock frequency input to a frequency outside the cut-off frequency of the phase-locked loop through speeding up a phase variation of the divided frequency component with respect to the reference clock frequency input at successive zero-crossings thereof.

18. The circuit of claim 17,
wherein the clock gating signal is configured to be applied to a gating logic associated with a clock input to a divider of the phase locked loop configured to generate the divided frequency component from the output frequency thereof,
wherein the gating logic is configured to receive the output frequency as another input thereto, and
wherein the gating logic is further configured to gate the clock input to the divider for the at least one clock cycle of the output frequency during every clock cycle of the reference clock frequency input based on the first constant state and the second constant state of the clock gating signal.

19. The circuit of claim 17, wherein at least one of the delay logic and the pulse generation logic is disabled through a firmware associated with the phase-locked loop when the output frequency and the reference clock frequency input are in a non-near-integer relationship.

* * * * *